MATRIX ENCODER CIRCUIT EMPLOYING PLURAL TRIGGER MEANS EACH COMPRISING A CURRENT SWITCH AND IMPLICATION CIRCUIT

Filed Aug. 28, 1962 4 Sheets-Sheet 1

INVENTORS
FRED K. BUELOW
FRANK B. HARTMAN
ERNEST L. WILLETTE

BY Joseph C. Redmond, Jr.

ATTORNEY

Feb. 1, 1966 F. K. BUELOW ETAL 3,233,223

MATRIX ENCODER CIRCUIT EMPLOYING PLURAL TRIGGER MEANS
EACH COMPRISING A CURRENT SWITCH
AND IMPLICATION CIRCUIT

Filed Aug. 28, 1962 4 Sheets-Sheet 2

United States Patent Office 3,233,223

Patented Feb. 1, 1966

3,233,223

MATRIX ENCODER CIRCUIT EMPLOYING PLURAL TRIGGER MEANS EACH COMPRISING A CURRENT SWITCH AND IMPLICATION CIRCUIT

Fred K. Buelow, Frank B. Hartman, and Ernest Leon Willette, Poughkeepsie, N.Y., assignors to International Business Machines Corporation, New York, N.Y., a corporation of New York Filed Aug. 28, 1962, Ser. No. 219,929

18 Claims. (Cl. 340—166)

This invention relates to decoding circuits and, more particularly, to high speed decoding circuits employing unique logical circuitry.

With cycle times being constantly reduced for present day and future data processing apparatus, it is imperative that the decoding portion of a cycle be minimized in order that an instruction be executed before the end thereof. Additionally, decoders should provide outputs which have small skew, good rise times and a minimum signal delay. One alternative for realizing these advantages is through improved logical circuitry and interconnection. Such logical circuitry should utilize relatively few active elements and be suitable for microminiaturization. It is desirable, therefore, to improve the performance and interconnection of logical circuitry in an effort to provide high speed decoders that will satisfy the requirements of present day and future data processing apparatus.

A general object of the invention is an advanced decoder for use in data processing apparatus having cycle times of the order of 100 nanoseconds (ns.).

One object is a trigger circuit responsive to the leading edge of an entering pulse and which becomes latched on the trailing edge of the entering pulse.

Another object is a trigger responsive to entering pulses having a duration of five nanoseconds (ns.) and providing an output after a single logical delay.

Another object is a trigger circuit adapted for integrated circuit technology.

Another object is a decoder that has an improved rate of operation, minimum signal delay, reduced driver loading and low skew.

These and other objects are accomplished in accordance with the present invention, one illustrative embodiment of which comprises a plurality of trigger circuits adapted to receive an incoming instruction to provide an output which selects a unique storage position in a matrix switch. Each trigger circuit comprises a current switch and an implication circuit connected to a first output circuit. The implication circuit is adapted to perform the logical function $(X+\overline{Y})$ which advantageously lends itself to the present invention. A second output circuit is solely connected to the implication circuit at another point. An input signal is supplied to the current switch and a data or timing signal is supplied to both the current switch and the implication circuit. The first output circuit provides a true output and the second output circuit provides a complement output relative to the input signal. The trigger circuits are adapted to be set on the rise time of the data signal and latched on the trailing edge of the data signal. A pair of tunnel diodes is connected to each output to provide better driving capabilities and pulse rise times. The true and complement outputs are supplied to respective driving or gating circuits which provide outputs to a matrix comprising a plurality of implication circuits. The simultaneous presence of a true and complement signal to an implication circuit produces a unique output signal indicative of the instruction or input signal to the trigger. The inputs of the implication circuits are equally divided among the outputs of the driving circuits. Accordingly, the number of circuits per output is reduced by the several outputs of the gating and trigger circuits. This feature decreases decoder operating time, minimizes skew and reduces logical delay.

One feature of the present invention is a trigger circuit that includes a current switch and an implication circuit responsive to a data signal, the latter providing an output indicative of its input and the former being set into a signal condition whereby the release of the data signal will cause the output of the current switch to be latched independent of any changes in the input signal.

Another feature is a current switch in combination with a cascode circuit, the combination being responsive to a data signal to provide an output corresponding to an input appearing at the cascode circuit whereby release of the data signal operates the current switch to retain the signal stored in the cascode circuit and simultaneously render the cascode switch insensitive to changes appearing at the input.

Still another feature is a trigger including a pair of implication circuits responsive to a data signal to provide an output at one circuit corresponding to the complement appearing at the input of that circuit whereby the release of the data signal will cause the other implication circuit to latch the output of the one implication circuit and render the circuit insensitive to signals appearing at the input thereof.

Another feature is a matrix switch that employs an implication circuit at each crosspoint, each circuit being adapted to receive a true and complement signal from a different driver source whereby a circuit is selected by the simultaneous presence of a true and complement signal.

Another feature is a matrix adapted to receive true and complement signal inputs to select a switching circuit at a particular crosspoint in the matrix.

Another feature is a plurality of trigger circuits and a plurality of cascode logical blocks arranged in a decoder, the latter providing true and complement outputs to the logical blocks through suitable gating circuitry so that the number of logical blocks on every output is balanced and minimized to reduce skew and improve signal transmission speed.

The foregoing and other objects, features and advantages of the invention will be apparent from the following more particular description of preferred embodiments of the invention, as illustrated in the accompanying drawings.

Figure 6:
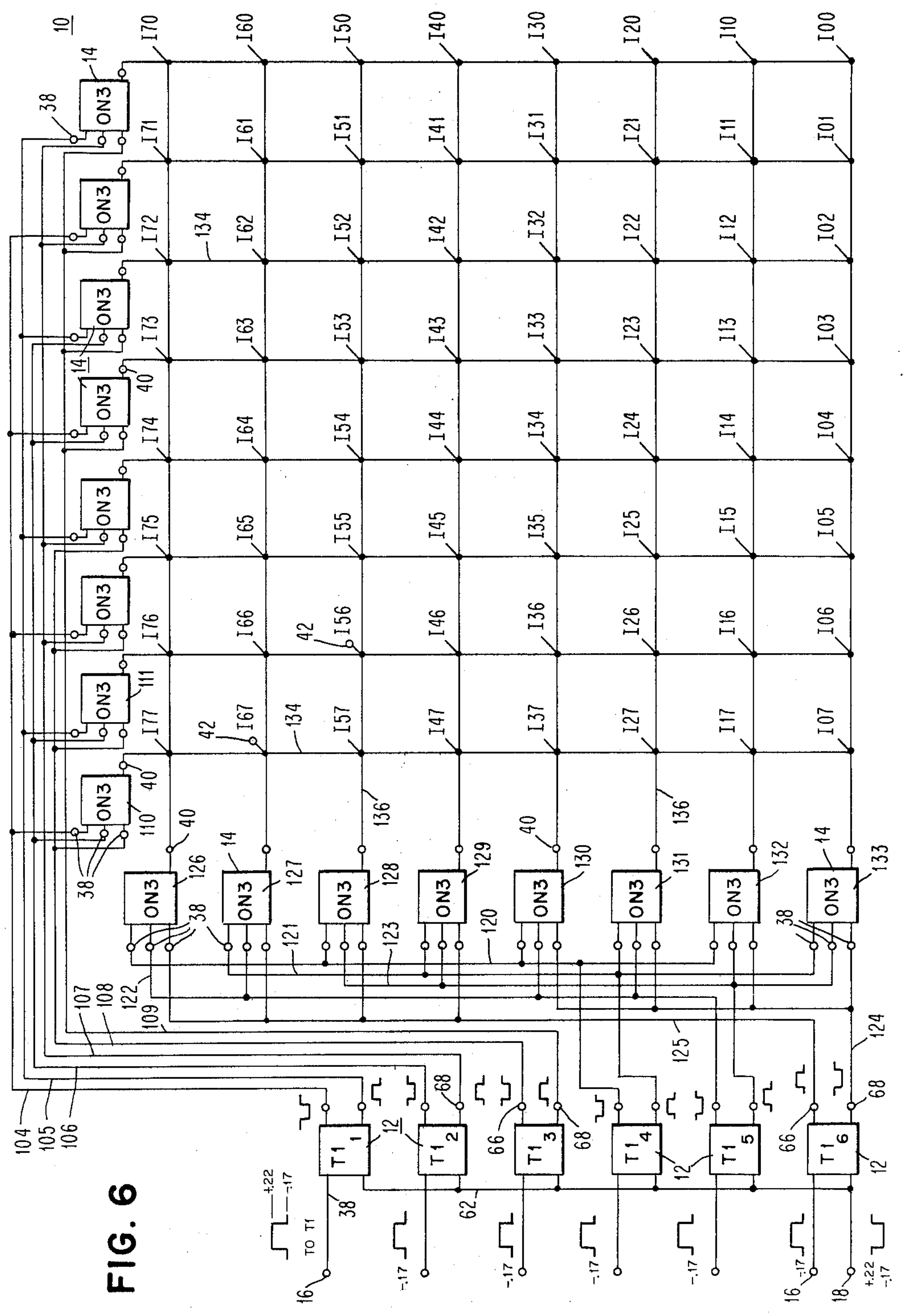
FIGURE 6 is an electric schematic of a plurality of trigger circuits of the type shown in FIGURE 3 and a plurality of gating circuits or current switches of the type shown in FIGURE 1 arranged as a decoder.

Briefly, referring to FIGURE 6, one decoder includes a switching matrix 10 connected to a plurality of triggers 12 through gating or driving circuits 14. The decoder is adapted to translate a six-bit binary code into a discrete output from a matrix. The trigger circuits are adapted to receive the instruction or input signal at terminals 16 and a data or timing signal at terminals 18. The trigger, in response to the instruction signal, provides true and complement output signals to the gating circuits 14. Each gating or driving circuit is connected to at least three trigger circuits and provides a single output circuit to a row or column of the matrix switch. One portion of the gating circuits is connected to one set of trigger circuits and provides columnar or vertical inputs to the matrix. The other portion of the gating circuits is connected to a second set of trigger circuits and provides the horizontal or row inputs to the matrix switch. A switching circuit is located at the respective intersections or crosspoints of the horizontal and vertical inputs. Each intersection has been given an alpha numeric designation beginning with I00 and extending through I77. When horizontal and vertical inputs are provided at an intersection or crosspoint, an output is provided in the usual manner. It is believed readily apparent that any binary input or instruction signal supplied to the trigger circuits will be translated into a unique output from the matrix. Thus, the input signal, in effect, is decoded into a unique output by the cooperation among the trigger, gating and switching circuits of the present invention. The particular circuits of the decoder, namely, the trigger, gating and switching circuits, included in the matrix, cooperate in a novel manner to provide an output signal that has minimum signal delay, reduced skew and loading on the trigger circuits. Before discussing the complete operation of the decoder, it is believed in order to describe the trigger, gating and switching circuits of the present invention.

Figure 1:
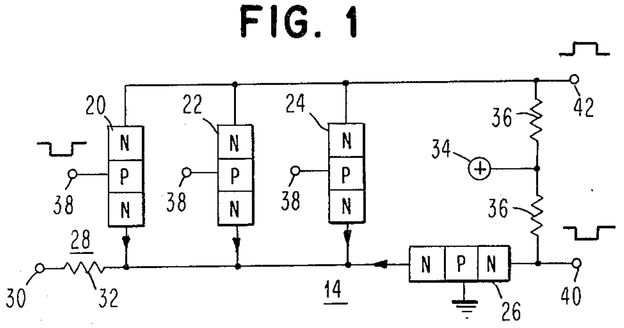
FIGURE 1 is an electric schematic of a current switch employed in the present invention.

Referring now to FIGURE 1, the gating circuit 14 includes three transistors 20, 22 and 24 and a common base amplifier 26 connected to a current supply 28, the latter comprising a voltage source 30 of suitable polarity and a load resistor 32. The transistors 20, 22, 24 and the amplifier 26 are suitably biased from a supply 34 connected to load resistors 36. Normally, the transistors 20, 22 and 24 are conducting and the transistor amplifier 26 is nonconducting. When an input signal is received at terminals 38 of the transistors 20, 22 and 24, the amplifier 26 becomes conducting and the transistors become nonconducting. Output terminals 40 and 42 provide true and complement signals, respectively, of the input signal. The gating circuit is well-known in the art and is commonly referred to as a current switch. The particular details of a current switch are described in U.S. Patent No. 2,964,652 which is assigned to the same assignee as that of the present invention. The gating circuits may be employed in one of several forms. In one form the true output may be employed and in another form the complement output may be employed. Still in a third form the true and complement outputs may be employed. The present invention is adapted to utilize at least two alternatives of the current switch.

Figure 1A:
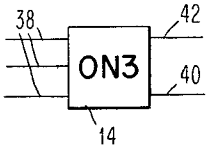
FIGURE 1A is a block representation of the circuit of FIGURE 1.

Gating circuits of the type shown in FIGURE 1 will be represented by a block 14, shown in FIGURE 1A, having the designation ON3 therein. The inputs to the circuit are represented by the lines appearing at the left hand side of the block. The outputs are represented by the lines appearing at the right hand side of the block.

Figure 2:
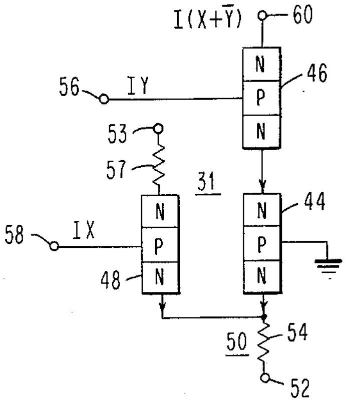
FIGURE 2 is an electric schematic of an implication circuit employed in the present invention.

One switching circuit 31 employed in the matrix is shown in FIGURE 2 and includes transistors 44, 46 and 48, the transistors 44 and 46 being connected in a cascode arrangement. The transistor 48 is emitter coupled to the transistor 44. The common emitter connection is coupled to a current supply 50 including a voltage source 52 of suitable polarity and a load resistor 54. A voltage supply 53 and a load resistor 57 are connected to the collector of the transistor 48. Input leads 56 and 58 are connected to the base electrodes of the transistors 46 and 48, respectively. The base electrode of the transistor 44 is grounded. An output circuit 60 is connected to the collector of the transistor 46. A load circuit (not shown) is also connected to the latter electrode.

Normally, the transistors 46 and 48 are non-conducting and the transistor 44 is conducting. The current flow through the transistor 44 is limited due to the infinite load impedance of the transistor 46. When an input signal is received at terminals 56, the output circuit provides the logical function $X+\overline{Y}$. An input signal at terminal 58 will terminate the output signal. Thus, the circuit operates in response to true and complement signals at terminals 56 and 58, respectively. The particular details of this circuit are described in a previously filed application, Serial No. 143,075 dated October 5, 1961 and assigned to the same assignee as that of the present invention. The logical function $X+\overline{Y}$ will hereinafter be referred to as an implication function. The derivation of the term is based on the text "The Elements of Mathematical Logic" by Paul Rosenbloom, Dover Publication, New York, N.Y., 1950, Page 30. The implication function eliminates the need in the decoder for signal inverting circuits since the true and complement signals are generated by the function.

Figure 2A:
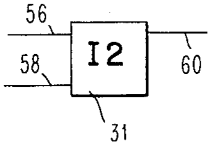
FIGURE 2A is a block representation of the circuit of FIGURE 2.

The switching or implication circuit 31 will also be represented by the block 31 shown in FIGURE 2A, having the designation I2 therein. The inputs to the circuit are indicated at the left side of the block. The output is indicated at the right side of the block.

Figures 3, 3A:
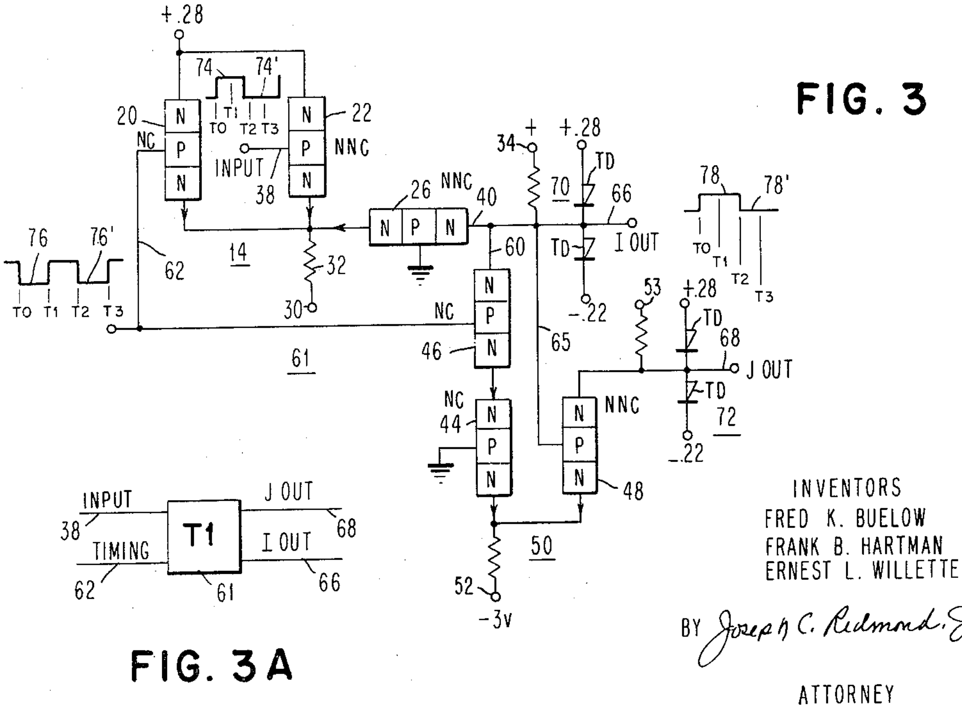
FIGURE 3 is an electric schematic of one trigger circuit employed in the present invention.
FIGURE 3A is a block representation of the trigger of FIGURE 3.

Several trigger circuits are suitable for use in high speed decoders. FIGURE 3 discloses a trigger circuit 61 that includes a current switch 14 and an implication circuit 31. For reasons of convenience in explanation, like reference characters utilized in connection with the description of FIGURES 1 and 2 will be employed in FIGURE 3.

The trigger circuit 61 has a first output circuit 66 which is connected to the output circuits 40 and 60 of the current switch 14 and implication circuit 31, respectively. A second output circuit 68 is coupled to the collector of the transistor 48 included in the implication circuit. The output circuits 66 and 68 provide true and complement signals, respectively, with respect to an input signal supplied to transistor 22 of the gating circuit. The true and complement signal will be designated by the symbols I and J, respectively, for reasons more apparent hereinafter. A data or timing circuit 62 is connected to the base electrodes of the transistors 20 and 46. Completing the trigger circuit is a connection 65 between the output circuit 66 and the base of the transistor 48, this connection establishing a feedback circuit which operates to latch the data appearing at the input of the current switch. Tunnel diode pairs 70 and 72 suitably biased, are connected to the output circuits 66 and 68, respectively. The tunnel diodes provide better drive capabilities and rise times for the output pulses. The tunnel diode pair 72 may be replaced with a load resistor if the drive capabilities are not needed. If the output 68 is not used as a logical output, it can be used to operate an indicator lamp or it can be shorted to the power supply.

The trigger 61 will be represented by the block 61 shown in FIGURE 3A, having the designation T1 therein. The entering data is shown on the left side of the block. The trigger output is shown on the right side of the block.

Before a timing signal 76 (see FIG. 3) appears and with the output 66 voltage down, the transistors 20, 44 and 46 conduct. The positive level of the timing signal renders the transistors 20 and 46 conducting. Transistor 44 is always forward biased and conducts according to the conducting condition of the transistors 44 and 48. Transistors 26 and 48 are nonconducting due to their base voltages being equal to or less than their emitter voltages. Transistor 22 may or may not be conducting according to the signal supplied to the input terminal 38. Normally, this signal is presumed to be down. Accordingly, in one condition, the output is held down by the absence of the timing signal. The transistor 48 changes conductivity according to the output signal appearing at the terminal 66. For a down output signal, the transistor is nonconducting. An up output signal renders the transistor 48 conducting. When the transistor 48 conducts, current from the source 50 is bypassed from the transistors 44 and 46 even though these transistors may be forward biased by a timing signal. The basis for this operation is given in the previously filed application, Serial No. 143,075, filed October 5, 1961. When a timing signal 76 appears at T0, the transistors 20 and 46 are reverse-biased. An input 74 signal at terminal 38 is gated through the transistor 26 to the output circuit 66. Assuming the input signal is positive, the transistor 22 conducts and maintains the lowered emitter voltage of the amplifier 26. Accordingly, the amplifier 26 does not conduct which results in an up output 78 corresponding to the input. The output 66 is also applied as an input to the transistor 48 which conducts and inverts the input to provide a complement output at terminal 68. One or the other of the tunnel diodes is switched by the output signals to improve the pulse rise times and drive capabilities.

On release of the data or timing signal at T1, the output appearing at terminal 66 is latched through the loop including transistors 48, 44 and 46. The transistor 20 changes to a conducting condition which insures that the transistor 26 will always be nonconducting during this period. The output at the terminal 66 is continued in an up condition. With the output up, the transistor 48 continues to conduct to keep the output up by retaining the transistor 46 nonconducting. The up voltage at the terminal 66 approaches the supply voltage 34 with the transistors 26 and 46 nonconducting. The down voltage at the terminal 68 approaches the supply voltage 52. The transistors 20 and 48 are conducting. The transistor 22 may or may not conduct according to the input signal. The change in conducting condition of the transistor 22 will not affect the output since the transistor 26 is nonconducting and isolates the input circuit from the output circuit. Thus, as shown, a drop in the input signal before T2 will not change the output signal 78. At time T2, timing pulse 76′ appears. The transistor 20 is reverse biased and rendered nonconducting. The transistor 46 is reverse biased and continued nonconducting. The transistor 22 is nonconducting as a result of input signal 74′. The transistor 26 conducts, however, with both transistors 20 and 22 nonconducting. The output voltage at the terminal 66 falls toward the emitter supply voltage 30. The transistor 48 is rendered nonconducting as a result of the reduced output voltage at terminal 66. The output voltage at terminal 68 is up and approaches the collector supply voltage 53. Thus, between the times T2 and T3, the output pulse 78′ is changed to a down level and the output signal at terminal 68 is changed to an up level.

When the timing pulse 76′ terminates at time T3, the transistor 20 is rendered conducting. The transistor 26 becomes nonconducting when the transistor 20 conducts. The transistors 44 and 46 change to a conducting condition when the timing pulse 76′ is removed since the transistor 48 is nonconducting by the down level at terminal 66. The output signal 78 at terminal 66 is maintained at the down level by the collector voltage of the transistor 46 which falls toward the supply voltage 52. Thus, transistor 48, is maintained in a nonconducting condition which permits the transistors 44 and 46 to continue to conduct. The output signal at terminal 68 is up with the transistor 48 continued in a nonconducting condition. As in the time period T1–T2, any input signal changes at transistor 22 will not affect the output because the transistor 26 is nonconducting. Summarizing, during a timing period, the current path through the transistors 46, 44 or 48 is selected. Upon removal of the timing pulse, subsequent changes at the input terminal 38 have no effect on the output. The transistor amplifier 26 is always nonconducting during this period since the transistor 20 is conducting.

The operation of the trigger, shown in FIGURE 3, may be summarized by considering the input pulses 74, data pulses 76 and output pulses 78, indicated adjacent to the appropriate transistor terminal. The pulses 74, 76 and 78 are indicated for times T0, T1, T2 and T3. Prior to time T0, the output is down, since the transistor 48 is nonconducting and the transistor 46 conducting. The amplifier 26 is nonconducting due to the up signal level at the transistor 20. At time T0, it will be apparent that the up information appearing at the input terminal 38 is gated through the trigger to the output terminal 66 after a single delay. The output signal turns on the transistor 48. The transistors 20 and 46 are nonconducting due to the data signal level being down. The amplifier 26 is nonconducting due to the transistor 22 conducting. The output at terminal 68 appears after two logical delays. It will be noted that at time T1 the output is latched at the trailing edge of the data pulse and the trigger becomes insensitive to subsequent changes at the input after the data signal is removed. During this period, the current established through the transistor 48 keeps the transistor 46 nonconducting even though forward biased by the signal level of the absent data signal. The amplifier 26 is also nonconducting due to the transistor 20 conducting. The amplifier 26 isolates the output circuit from the input circuit. The output of the trigger is maintained at time T2 for data pulse 76 and input pulse 74. The output pulse 78′ is down since the input is down. The down output 78′ sets a current flow through the transistors 46 and 44 so that at time T3, the circuit is latched when the data pulse is removed. Subsequent changes at the input 38 do not alter the output since the amplifier is nonconducting and isolates the output 66 from the input 38. Laboratory experience has indicated that the trigger can operate with a data pulse of as short as 5 nanoseconds in duration.

The output at terminal 68 is the inverse of that at the terminal 66 since the transistor 48 operates as an amplitude inverter.

Figure 4:
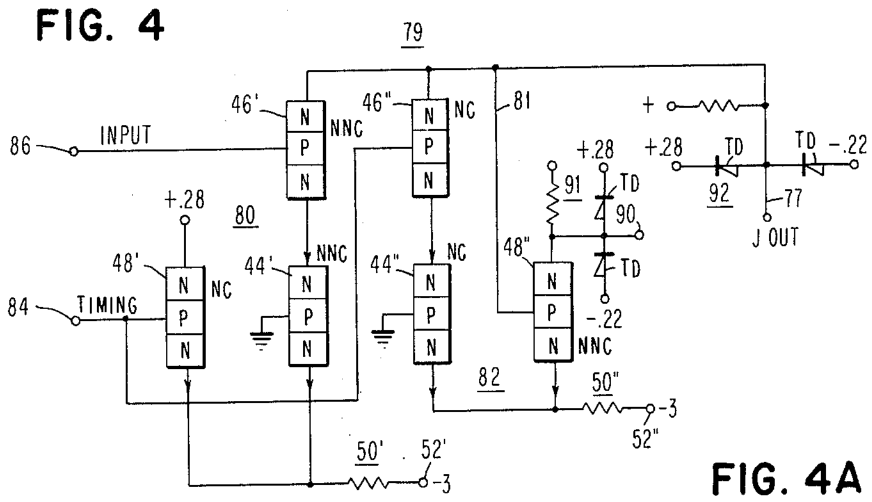
FIGURE 4 is an electric schematic of a second embodiment of a trigger circuit employed in the present invention.

A second trigger 79 is shown in FIGURE 4. Included in the trigger are two implication circuits 80 and 82. The implication circuit elements having primed reference characters for those elements that correspond to the elements appearing in FIGURE 2.

Figure 4A:
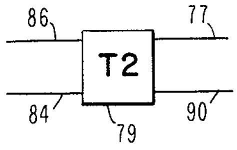
FIGURE 4A is a block representation of the trigger of FIGURE 4.

The trigger 79 has a timing circuit 84 connected to the base electrodes of the transistors 48′ and 46″. An input circuit 86 is connected to the base electrode of the transistor 46′. A first output circuit 77 is connected to the collector electrodes of the transistors 46′ and 46″. The output circuit 77 is also connected through lead 81 to the base electrode of the transistor 48″. A second output circuit 90 is connected to the collector electrode of the transistor 48″. The output circuits 77 and 90 provide complement and true signals, respectively, corresponding to an input signal appearing at terminal 86. Pairs of tunnel diodes 91 and 92 are suitably biased and connected to the output circuits for reasons previously indicated. The substitution of a short, load resistor or indicator for the tunnel diodes 91 is possible. The trigger 79 will be represented by the block diagram 79, shown in FIGURE 4A, having the designation T2 therein.

Normally, the transistors 48′ and 46″ are conducting whereas the transistors 46′ and 48″ are nonconducting. This condition, however, is subject to change depending upon the information condition previously appearing at the output terminal 77. The transistors 44′ and 44″, in any case, however, are always conducting due to the base voltage being greater than the emitter voltage. When an entering or timing pulse is received at the trigger, the transistors 48′ and 46″ are turned off so that the input signal appearing at terminal 86 is transmitted to the output circuit 77 in inverted form. When the input signal is up, the output signal appearing at terminal 77 is down due to the transistors 46′ and 44′ conducting. The down output signal turns off the transistor 48″ so that on release of the timing signal, the output circuit will become latched to the voltage source 52″ by the transistors 46″ and 44″ conducting. In the event the input signal is down when the timing pulse is released, the output 77 becomes latched to the collector voltage of the transistors 46′ and 46″ which are not conducting at this time. On release of the timing signal, the transistors 48′ and 48″ conduct and maintain the transistors 46′ and 46″ nonconducting. Once the current path is selected between the transistors 46″, 44″ or 48″ any change at the input will not alter the output since the absence of the timing signal maintains the transistor 46′ nonconducting with the transistor 46″ nonconducting. The output is isolated from changes at the input. The trigger provides a complement output at terminal 77 after a single logical delay and a true output at terminal 90 after two logical delays. Again, as in the case of the trigger, shown in FIGURE 3, the data signal appearing at the input of the trigger is transmitted to the output when the timing signal appears and the output becomes latched on release of the timing signal.

Figure 5:
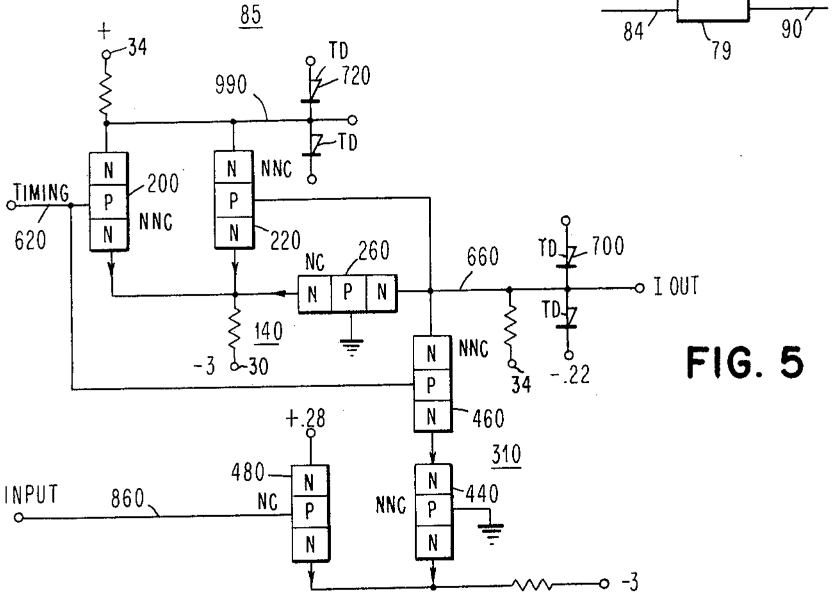
FIGURE 5 is an electric schematic of another embodiment of a trigger circuit employed in the present invention.

Still another trigger circuit 85 is shown in FIGURE 5. Included in the circuit are a current switch 140 and an implication circuit 310. Circuit elements shown in FIGURE 5 have been assigned reference character designations corresponding to those appearing in FIGURES 1 and 2. To distinguish the circuit elements in FIGURE 5 from those shown in FIGURES 1, 2, 3 and 4, the circuit elements have been assigned three digit reference characters where the first two digits correspond to an equivalent element indicated in another figure and the last digit is a zero.

Figure 5A:
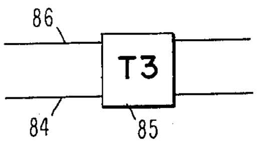
FIGURE 5A is a block representation of the trigger of FIGURE 5.

The trigger circuit, shown in FIGURE 5, is similar in construction to that shown in FIGURE 3 with the exception that the input signal is applied to a different circuit and an output circuit is taken at a different point. As in the case of FIGURE 3, a timing circuit 620 is connected to the base electrodes of the transistors 200 and 460 of the current switch 140 and the implication circuit 310, respectively. A first output circuit 660 is connected to the collectors of the transistors 260 and 460, this output circuit providing the true of a signal supplied to an input circuit 860 connected to the base electrode of transistor 480. A second output circuit 990 is connected to the collectors of the transistors 200 and 220, this output circuit providing the complement of the input signal. The output circuit 660 is also returned to the base of the transistor 220 for reasons to be described hereinafter. A pair of tunnel diodes 700 and 720 is suitably biased and connected to the output circuits 660 and 990 for reasons previously indicated. The substitution of a short, load resistor or indicator for the tunnel diodes 700 is also possible. The trigger 85 will be represented by a block 85, shown in FIGURE 5A, having the designation T3 therein.

Normally, the transistors 200 and 460 are nonconducting and the transistor amplifier 260 is conducting or nonconducting depending upon the previous signal condition. In the case of the implication circuit 310, the transistor 480 is nonconducting and the transistor 440 conducting. The output signal at the terminal 660 sets the output at the terminal 990.

When a positive entering or timing pulse appears, the transistors 200 and 460 are caused to conduct so that the transistor amplifier 260 is cut off. The transistor 460, however, only turns on according to the input appearing at the transistor 480. In the event the input is up, the transistor 480 conducts which nullifies the turn-on of the transistor 460 by the input pulse. As a result, the voltage level at the terminal 660 remains in an up condition which turns on the transistor 220 to provide a down signal at the output terminal 990. In the event the input is down, the transistor 480 is turned off so that the transistor 460 conducts and in so doing provides a down signal at the output terminal 660. The down signal at the terminal 660 turns off the transistor 220. The amplifier 200, however, conducts due to the up signal applied by the timing signal. Accordingly, the transistor 260 is nonconducting for either a positive or negative input signal. On release of the timing signal both the transistor 200 and 460 become nonconducting and the circuit latches through the transistors 220 and 260 to provide a down or up signal at the terminal 990, according to the previous input signal at terminal 860. For an up input signal, the output at terminal 660 is held up by the transistors 460 and 260 which are reverse biased by the removal of the timing pulse and the conducting condition of the transistor 220, respectively. Then the up output at terminal 660 approaches the supply voltage 34. The down output at terminal 990 (transistor 220 conducting), approaches the supply voltage 30. For a down input signal at terminal 860, the output at the terminal 660 is held down by the transistor 260 which conducts when the transistors 200 and 460 are turned off upon the removal of the timing signal. The down output at the terminal 660 approaches the emitter supply voltage 30. The output voltage at terminal 990, however, is up approaching the collector supply voltage 34 since the transistor 220 is held nonconducting by the down output at the terminal 660. Since transistor 460 is nonconducting when the entering or timing pulse is absent, any changes at the input circuit 860 will not affect the output at terminal 660 which in turn affects the output at the terminal 990.

Again, as in the case of the trigger shown in FIGURES 3 and 4, the input data is transmitted to the output terminals when the entering or timing signal appears and becomes latched when the entering signal falls. The trigger, shown in FIGURE 5, however, responds to entering or timing pulses of positive polarity whereas the triggers, as shown in FIGURES 3 and 4 respond to timing pulses of negative polarity. The signal delay through the trigger 85, however, is greater than that for the triggers 61 and 79, the former having a signal delay from the data input of three or four transistors whereas the latter has signal delays of two or three transistors. The trigger 85, as will appear hereinafter, however, is better adapted for orthogonal control, i.e., the elimination of plural transients when a series of such triggers are employed in control rings or counters.

With regard to orthogonal control, the output of the control triggers are often utilized to develop a broad side gate control. In such an arrangement, the state of the triggers is changed simultaneously by stepping each control trigger with a short control pulse. It is desirable in such an arrangement to prevent adjacent triggers from conducting at the same time. The trigger 85 will accomplish this result. This will be illustrated by considering an example of two triggers 85 arranged to receive the same data signals. Assume, for example, that the complement outputs of the first and second triggers are up and down, respectively, and input signals up and down, respectively, are received to change the complement outputs to down and up, respectively. When the entering signal appears, the trigger having the up signal will provide a down complement signal due to the fact that the transistor 220 is conducting. The trigger receiving a down input signal will continue to provide such a signal due to the conduction of the transistor 200. Thus, for a period of time both triggers are providing down signals. On release of the entering signal, the trigger receiving the appropriate input signal will provide an up complement signal whereas the other trigger will continue to provide a down complement signal. Thus, as between the two triggers, only one trigger has provided an up complement signal. The development of this type of trigger operation has been found to result in large savings in hardware and faster operation of decoders and other information processing apparatus.

Having described the structural arrangement and operation of the various circuitry, the remaining paragraphs of the specification will be devoted to describing the structure and operation of the decoders.

Returning now to FIGURE 6, the decoder employs the trigger T1 (61) shown in FIGURE 3, and the gating circuits ON3 described in connection with FIGURE 1. A two input gating circuit is employed at the crosspoints I00 through I77. The two input gating circuits are identical to the gating circuit, shown in FIGURE 1, with the exception that one of the transistors 20, 22 or 24 is omitted.

The triggers 61 are connected to the terminals 16 and 18 through the circuits 38 and 62. True and complement outputs are provided at their respective terminals 66 and 68. The triggers are arranged into groups of three, one group being designated triggers 1 through 3 and connected through coupling lines 104 to 109 to the gating circuits 14 designated gates 110 through 117. A second group of trigger designated triggers 4 through 6 is connected through coupling lines 120 to 125 to the gating circuits 14 designated gates 126 to 133. Each gating circuit is connected to three of the triggers in the group with which they are associated. Each gating circuit receives a different combination of coupling lines so that the original six digit input signal supplied to the triggers 61 has been expanded into sixteen octal code groups.

The common lines 104 to 109 and 120 to 126 are connected to the base electrodes 38 of the transistors 20, 22 and 24, not shown) included in the gating circuit. The gating circuits 110 to 117 provide the vetrical or columnar drive through lines 134 to the matrix and the gating circuits 126 through 133 provide the horizontal or row drive through lines 136 to the matrix. The intersections of the various drive lines form crosspoints to which gating circuits 14 having two inputs are connected. The true lines to each crosspoint switching circuit are connected to the base electrodes 38 of the transistors 20 and 22 (not shown). Each crosspoint switch provides a complement output signal at terminal 42.

A six digit input signal to the triggers 61 provides a discrete output from the matrix after a data signal is supplied. Prior to the arrival of the entering signal, the triggers are insensitive to changes at the input for reasons indicated in connection with the description of FIGURES 3, 4 and 5. Assuming a pulse input shown adjacent to the respective input terminals of the triggers, an output is provided to the gating circuits as indicated by the pulse arrangement indicated on the coupling lines 104 through 109 and 120 through 125. The pulse arrangement on the line assumes that no information had been set in the triggers prior to the data pulse. The triggers 1 through 5 provide an output pulse that is down on the lines 104, 106, 108, 120 and 122. The output on the coupling lines 105, 107, 109, 121 and 123, however, is up. In the case of trigger 6, however, the coupling lines 124 and 125 are down and up, respectively. This pulse arrangement provides at least one up or positive signal to all gating circuits except the circuits 110 and 130 which receive all down or negative signals. The gating circuits, as will be recalled, provide a true output. Thus, all row and columnar drive lines 134 and 136, respectively, carry positive or up signals except the drive lines connected to the gating circuits 110 to 130 which carry down or negative signals. The output signals from the gating circuits 110 and 130 operate the current switch at crosspoint I37 to provide a positive output signal from the matrix. This output signal is the only one that is positive from the matrix since all other crosspoints receive at least one positive input signal from the gating circuit, a positive input signal operating the current switch at the crosspoint to provide a negative output signal at the complement terminal or output terminal 42.

Thus, the decoder operates in response to the input signal to provide a unique output signal from the matrix 12. The decoder circuits are symmetrically arranged, in that each trigger is connected to eight gating circuits and eight current switches in the matrix. This feature reduces any skew appearing in the decoder. Further, the balanced loading in the circuit increases the overall speed since there is no worse case condition that exists in the decoder. Finally, the transistor or logical delay is minimized through the decoder in that the output pulses from the triggers occur after one or two logical delays according to a true or complement output. Thus, the present invention has provided a decoding circuit that has reduced skew, improved operating speed and minimum signal delay. In the event that skew does present a problem, however, another transistor may be added to the gating or switching circuitry for clock inputs.

Figure 7:
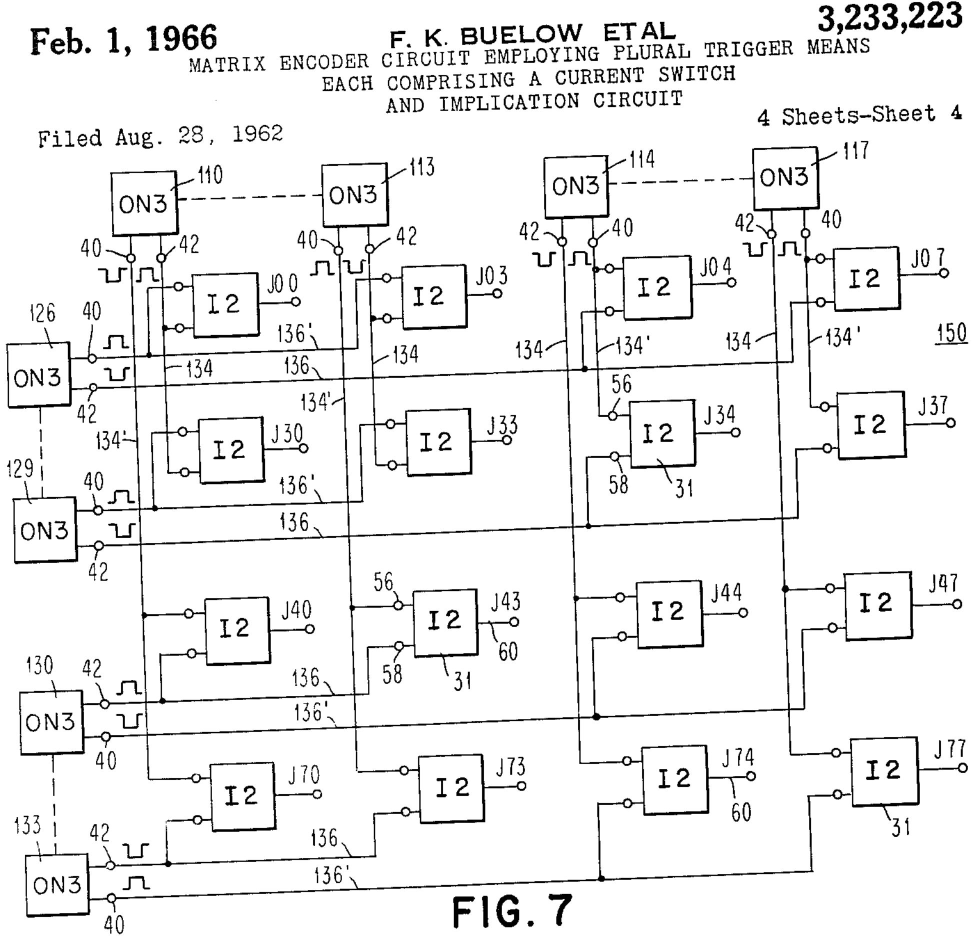
FIGURE 7 is an electric schematic of a plurality of implication circuits of the type shown in FIGURE 2 arranged as a matrix switch for use in the decoder shown in FIGURE 6.

Another embodiment of the decoder includes a matrix network 150, shown in FIGURE 7, that may be substituted for the matrix 10 shown in FIGURE 1. The matrix substitutes implication circuits 31 (see FIGURES 2 and 2A) for the two input current switches 14 employed in FIGURE 6. Each implication circuit is connected at terminals 56 and 58 to the appropriate gating circuit. All the gating circuits 110 through 117 and 126 through 133 provide true and complement output signals at the terminals 40 and 42, respectively. The output terminals 40 and 42 for the gating circuits 110 through 117 are connected to columnar or vertical drive lines 134 and 134'; the true output 40 being connected to the line 134' and the complement output 42 being connected to the line 134. The output terminals 40 and 42 for the gating circuits 126 through 133 are connected to row or horizontal drive lines 136 and 136', the true output 40 being connected to the line 136' and the complement output 42 being connected to the line 136.

Each implication circuit 31 receives a true and complement output from different gating circuits. The true signal is supplied by a gating circuit in either the row or columnar drives and the complement is supplied by the other drive. Thus, in row 1, the gating circuit 126 provides the true to the implication circuits J00 through J03 and the complement to the implications circuits J01 through J07. The other input to these implication circuit groups is supplied by the gating circuits 110 through 113 and 114 through 117. This pattern is repeated for the upper four rows of the matrix. The lower four rows of the matrix reverse this process, i.e., the gating circuits 130 through 133 supply the complement output to the first four columns of the matrix and the true output to the last four columns of the matrix (column numbering starting on the left and proceeding to the right). The other input to these implication circuit groups is supplied by the gating circuits 110 through 113 and 114 through 117.

The operation of the decoder employing the matrix, shown in FIGURE 7, will now be described. The trigger circuits 61 and the gating circuits 14 operate in the manner previously described. Accordingly, any input signal to the triggers operates one gating circuit to develop a down and up signal at its complement and true signals, respectively, while the remaining gating circuits of the decoder provide an up and down signal at their true and complement terminals, respectively. For the same input signal to the decoder, shown in FIGURE 1, the signals appearing on the true and complement lines from the gating circuit are as indicated in FIGURE 7. The true lines from the gating circuits are connected to the base electrode 56 and the complement lines are connected to the base electrode 58 of the implication circuit. The presence of a positive signal on a complement line operates the implication circuit at the crosspoint to provide an up or positive signal at the output electrode 60. It will be noted that all complement output lines from the gating circuits are up except those lines connected to the gating circuits 110 and 126, the output from these gating circuits being down. The implication circuits J0 . . . 30, J50 . . . J70 connected to these gating circuits, however, receive a negative signal with the result that these circuits are still up or positive. Likewise, the implication circuits J41 . . . J47 also receive a negative input signal so these outputs are still up. The implication circuit 40, however, receives an up true signal and a down complement so that the output signal is down. Thus, the input signal supplied to the triggers 61 (see FIGURE 6) selects a single implication circuit, i.e., J40 in the matrix.

It should be noted, however, that the output signal from the implication circuit J40 is the complement of the input signal whereas in the decoder shown in FIGURE 6, the output signal is the true of the input signal supplied to the decoder. No problem is presented by this feature since memory drivers can be designed to employ the complemented form of the input signal to the decoder.

The potential speed of the decoder, shown in FIGURE 7, is increased over that indicated by the decoder shown in FIGURE 6. The gating circuits of the decoder, shown in FIGURE 7, supply only four implication circuits whereas previously the gating circuits supplied eight current switching circuits. Manifestly, the speed of the decoder will be advanced due to the reduced loading on the gating circuits. Again, as in the case of the decoder, shown in FIGURE 6, the loading throughout the decoder is symmetrical so that the skew is reduced and signal delay minimized through the elimination of any worse case condition.

Figure 8:
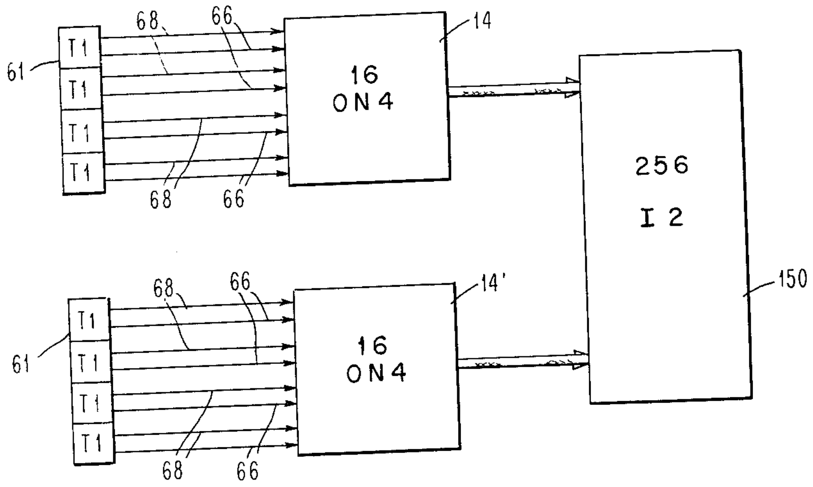
FIGURE 8 is a block diagram of a decoder employing triggers, current switches and implication circuits of the type shown in FIGURES 1, 2 and 3, respectively, arranged as a decoder for input instructions having more than six digits.

The present invention is readily adapted to provide decoders that handle more or less than six digits. One decoder adapted to handle eight binary digits is indicated in FIGURE 8. Reference characters assigned to the various blocks correspond to those circuit elements previously described in other figures. The numbers in the various blocks indicate the quantity of such circuits required in the decoder. Thus, the block 14 includes sixteen gating circuits of the type shown in FIGURE 1, except a fourth transistor has been added to the circuit. The fourth transistor is in parallel with the transistors 20, 22 and 24.

The block 14′ contains the same apparatus as the block 14. The block 150 contains 256 implications circuits 31 of the type described in FIGURE 2.

Each trigger provides true and complement outputs to eight loads or gating circuits in the block 14 or 14′. The interconnections are along the lines indicated in FIGURE 6. The sixteen gating circuits provide individual true and complements, each output being connected to eight loads in the matrix 150. Thus, a total of 256 inputs are supplied to the matrix so that for any signal to the triggers, one output is provided by the matrix.

It will be noted that the arrangement of the circuitry and the outputs provided are all within the capabilities of transistors and other active elements presently available on the commercial market. The uniform delays through the decoders and the number of logical levels required permits a second decode to start through the trigger while the first one is being sampled at the output. The through rate for successive decodes is limited by the sum of the sample time plus either (1) the block time between samplings required by memory drivers or (2) the approximate 2 nanosecond rise time of the net output plus the skew in the outputs. In general, the net outputs must experience one transit between samples. It is assumed, however, that it is always possible to time the launching of the new decodes via a trigger clock pulse so that their transients will arrive at the output between sampling. This maximum rate must in practice allow for the variations in delay through the net due to circuit tolerances and such effects as the skew and the input produced by the triggers. Repetition rates of 100 megacycles are reasonable with a sample time of 4 nanoseconds.

Thus, the present invention provides unique trigger circuits having selected outputs which may be advantageously arranged to develop decoders having reduced skew, uniform delay and increased speeds. Such decoders are necessary in present day and future data processing apparatus where it is desired to minimize the decoding portion in a cycle so that the necessary logic may be executed by the apparauts.

The circuitry shown in the present invention is amenable to manufacture by present day integrated circuit techniques. This technique employs a single substrate incorporating one or more active elements which are connected through suitable metallized strips to passive elements. Such circuits can be operated with low power input signals with the result that operating costs are reduced and circuit performance enhanced.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A trigger circuit comprising
 a first switching circuit,
 a second switching circuit having at least two current paths,
 an entering pulse circuit connected to the first and second switching circuits,
 an input circuit connected to the first switching circuit,
 means interconnecting the first and second switching circuits whereby a pulse appearing on the entering circuit will select one of the two current paths in the second switching circuit in accordance with an input appearing at the input circuit,
 and output circuit means connected to the first and second current paths to provide a first or a second signal level in accordance with the current path selected.

2. The trigger circuit defined in claim 1 wherein the means interconnecting the first and second switching circuits maintain the current path selected by the pulse appearing on the entering circuit on the removal of the pulse.

3. The trigger circuit defined in claim 2 wherein the first switching circuit includes means for isolating the output circuit from the input circuit after the current path has been selected and the pulse on the entering circuit removed.

4. The trigger circuit defined in claim 3 further comprising means connected to the output circuit to improve the rise time and drive capabilities of the signal level appearing thereupon.

5. A trigger circuit comprising
 a current switch connected to receive two inputs and provide an output,
 an implication circuit connected to receive two inputs and provide first and second outputs,
 an input circuit connected as one input to the current switch,
 an entering circuit connected as a first input to the implication circuit and as a second input to the current switch, means interconnecting the current switch output and the first output of the implication circuit as a first tirgger output, and means connecting the trigger output as a second input to the implication circuit whereby any signal level appearing on the input circuit will be latched at the first trigger output when a preselected signal level is present on the entering circuit.

6. The trigger circuit defined in claim 5 further comprising a second trigger output circuit connected to the implication circuit whereby a signal level appearing on the second trigger output circuit will be the complement of the signal level appearing on the first trigger output circuit.

7. The trigger circuit defined in claim 6 wherein the current switch includes means to isolate the input circuit from the first and second trigger output circuits when the preselected signal level is present on the entering circuit.

8. The trigger circuit defined in claim 7 wherein any input signal appearing at the input circuit appears at the first trigger output circuit after a single transistor delay when the preselected signal level is absent on the entering circuit and wherein the first trigger output becomes latched when the preselected signal level is present on the entering circuit.

9. A trigger circuit comprising a first implication circuit connected to receive first and second inputs and provide a first output, a second implication circuit connected to receive first and second inputs and provide first and second outputs, an entering circuit connected to the first inputs of the implication circuits, an input circuit connected to the second input of the first implication circuit, means connecting together the first outputs of the first and second implication circuits to form a first trigger output, and means connecting the first trigger output as a second input to the second implication circuit whereby a preselected signal level on the entering circuit will latch any signal level appearing on the input circuit at the first trigger output.

10. The trigger circuit defined in claim 9 further comprising a second trigger output circuit connected to the second implication circuit output, any signal level appearing on the second trigger output circuit being the complement of the signal level appearing on the first trigger output circuit.

11. The trigger circuit defined in claim 10 wherein a signal level appearing on the input circuit appears at the first trigger output as the complement thereof at the time the preselected signal level is absent on the entering circuit.

12. A trigger circuit comprising a current switch connected to receive first and second inputs and provide a first and second output, an implication circuit connected to receive first and second inputs and provide a first output, an entering circuit connected to first inputs of the current switch and the implication circuit, an input circuit connected to the implication circuit as a second input, means connecting together the first outputs of the current switch and implication circuit to provide a first trigger output, and means connecting the first trigger output as a second input to the current switch whereby any signal level appearing at the input circuit will be latched at the first trigger output when a preselected signal level appears at the entering circuit.

13. The trigger circuit as defined in claim 12 wherein a signal level at the first trigger output is the true of the signal level at the input circuit when the preselected signal level is absent.

14. The trigger circuit defined in claim 13 further comprising a second trigger output circuit connected to the current switch to provide output signal levels that are the complement of the signal levels at the first trigger output circuit.

15. A switching circuit comprising a first current steering circuit, a second current steering circuit, each current steering circuit including at least three transistors, a current supply, means connecting at least two transistors in each steering circuit to the current supply, to establish at least two current paths in each steering circuit.

a first input signal to a current path in each steering circuit, a second input signal to a current path in the first steering circuit not receiving the first input signal, a first output circuit connected to the first steering circuit, means connecting the first output circuit to the second steering circuit as a second input, and a second output circuit connected to the second steering circuit whereby the first input signal, when present, selects a current path in the second steering circuit and, upon removal, maintains the selected current path.

16. A decoder circuit comprising a plurality of trigger circuits, as defined in claim 1, each trigger circuit adapted to receive an input signal and a timing signal, a plurality of gating circuits, a plurality of switching circuits arranged in a matrix, said matrix having a plurality of horizontal and vertical inputs, a portion of the gating circuits providing vertical inputs to the matrix, the remaining portion of the gating circuits providing horizontal inputs to the matrix, and means connecting a portion of the trigger circuit to the horizontal gating circuit, the remaining portion of the trigger circuits being connected to the vertical gating circuits whereby an input to the trigger provides a discrete output from the matrix when a timing signal is supplied to the trigger circuits.

17. The decoder defined in claim 16 wherein each gating circuit receives a different combination of trigger circuit connections than the other gating circuits.

18. The decoder defined in claim 17 wherein the gating circuits provide true and complement output signals and the switching circuits perform the implication function, each switching circuit receiving a unique set of true and complement outputs.

References Cited by the Examiner

UNITED STATES PATENTS 3,086,128 4/1963 Litwiller ---------- 307—88.5

NEIL C. READ, *Primary Examiner.*

ARTHUR GAUSS, *Examiner.*